United States Patent [19]

Sjögren

[11] Patent Number: 4,728,911
[45] Date of Patent: Mar. 1, 1988

[54] LOSS-IMPAIRED FILTER APPARATUS FOR SUPPRESSING RADIO FREQUENCY INTERFERENCE ON A TWO-WIRE LINE

[75] Inventor: Carl T. H. Sjögren, Växsjö, Sweden

[73] Assignee: Telefonaktiebolaget L M Ericsson, Stockholm, Sweden

[21] Appl. No.: 890,564

[22] Filed: Jul. 30, 1986

[30] Foreign Application Priority Data

Aug. 27, 1985 [SE] Sweden .............................. 8503988

[51] Int. Cl.⁴ .......................... H03H 7/09; H03H 7/01
[52] U.S. Cl. .................................. 333/167; 333/177; 333/184; 333/185
[58] Field of Search ............... 333/12, 174–177, 333/140, 167, 181–185; 336/69, 84 M, 178, 200, 232, 233

[56] References Cited

U.S. PATENT DOCUMENTS 3,755,762  8/1973  Boulin et al. ....................... 333/185
3,798,059  3/1974  Astle et al. ........................ 336/232

FOREIGN PATENT DOCUMENTS 7016525 10/1974 Sweden .

Primary Examiner—Marvin L. Nussbaum
Attorney, Agent, or Firm—Burns, Doane, Swecker & Mathis

[57] ABSTRACT

A loss-impaired filter apparatus for suppressing radio frequency interference on a two-wire line. The apparatus includes a coil unit (10) comprising two coils (e.g. 3a) in the form of printed circuits on either side of an insulating plate (2), a ferrite casing (10a, 10b) surrounding the coil unit (1), there also being two capacitors (15a, 17a, 15b, 17b), the coatings of which are arranged at least practically parallel to the insulating plate (2) on two surfaces of the ferrite elements facing away from each other and facing away from the coil unit (1). Each of the coil conductors is situated directly opposite the other coil conductor along its entire length. The coating (15a, 15b) situated nearest the coil unit (1) in each capacitor is provided with an earth terminal (e.g. 16a) and the other coating (17a, 17b) in each capacitor is connected to the inner end point of the coil (e.g. 3a) situated nearest to the coating. The outer end points of the coils constitute connection poles of the apparatus towards one side of the two-wire line, and the outer capacitor coatings (17a, 17b) connected to the inner end points of the coils constitute the connection poles of the apparatus towards the other side of the two-wire line. The apparatus has low boundary frequency for asymmetric noise signals and high boundary frequency for symmetric useful signals, due to its functioning as a conventional lowpass filter for relatively low frequencies, the filter action of the lowpass filter being eliminated for the useful signals, while for radio frequency signals, it functions as two loss-impaired transmission lines.

6 Claims, 5 Drawing Figures

LOSS-IMPAIRED FILTER APPARATUS FOR SUPPRESSING RADIO FREQUENCY INTERFERENCE ON A TWO-WIRE LINE

TECHNICAL FIELD

The invention relates to a loss-impaired filter apparatus for suppressing radio frequency interference on a two-wire line.

BACKGROUND ART

Electronic equipment associated with modern telephony and data transmission installations is often fitted into a telephony apparatus cabinet which screens electromagnetic fields. The intention with this is, inter alia, to screen the equipment in the cabinet from exterior electro magneticfields but also to screen the surroundings from undesirable elctromagnetic fields generated by the equipment in the cabinet. Since the transmission lines can function as antennae both outside and inside the cabinet, radio frequency interference is, however, transferred from the outside of the cabinet to its inside and vice versa via these lines. The effects of this interference decreases if the transmission lines are coupled in series with filters which attenuate the undesired interference but permit transmission of the desired useful signals.

It is known to utilise lowpass filters which contain coils for this purpose. Such filters are however, burdened with the disadvantage that their attenuating effect decreases for high frequencies, due to the coils for high frequency signals no longer functioning as inductive elements but rather as capacitive elements. Filters built up from such loss-free discrete components furthermore only provide attenuation through reflection, the size of the attenuation thus being heavily dependent on the impedance of the equipment connected to the filter and the impedance of the transmission lines.

There is described in SE 716525-3 a loss-impaired high frequency filter, which consists of a conductor surrounded by a ferrite tube, which has been coated with layers of different materials and where the outermost layer constitutes the earth terminal. The filter functions as a loss-impaired line for signals with a frequency exceeding some tens of MHz and therefore has a too high boundary frequency for satisfactorily suppressing interference in the lower part of the radio frequency spectrum.

DISCLOSURE OF INVENTION

The object of the present invention is to provide a filter apparatus of the kind mentioned in the introduction, which has a small format and with a boundary frequency which is low for noise signals and high for useful signals. This is achieved with two coils which are formed as printed circuits and situated opposite each other on either side of an insulating plate, the unit formed by the plate and coils being surrounded by a ferrite casing provided with capacitors on its surfaces facing away from the plate.

Useful signals occur as so-called symmetrical signals in the two-wire line and under certain conditions may be unaffected, or at least practically unaffected by the filter apparatus. This is due to the magnetic fields generated by these signals in the coils being enabled to substantially cancel out each other. Undesired noise signals which have been induced in both lines, and therefore occur as so-called asymmetric signals (common mode), are on the other hand effectively attenuated under the same conditions. A comparatively low boundary frequency for asymmetrical noise signals can be obtained with a suitable implementation of the filter apparatus. Signals having a frequency exceeding about 10 MHz would appear substantially to consist of noise signals and are attenuated, since the filter apparatus will function as two loss-impaired lines for such high frequency signals. Since the conductors of the filter apparatus are disposed as coils, they are longer than corresponding conductors in the filter according to the above-mentioned SE 7016525-3. In this way is also obtained an effective attenuation of high-frequency noise signals.

The characterizing features of the invention are apparent from the claims.

BRIEF DESCRIPTION OF DRAWINGS

The invention will now be described in detail with reference to the drawings, where.

BEST MODE FOR CARRYING OUT THE INVENTION

Figure 1:
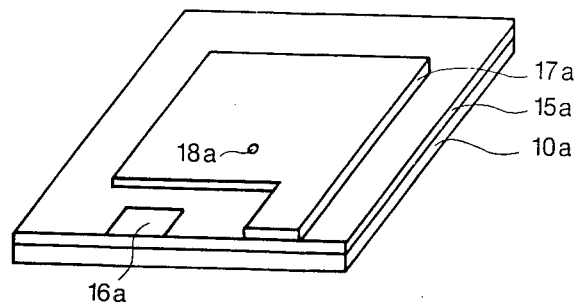
FIG. 1 is an exploded perspective sketch of a filter apparatus in accordance with the invention.
Figure 1:
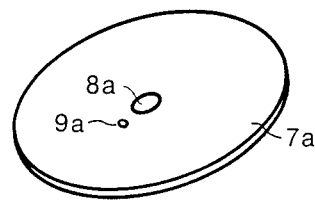
Figure 1:
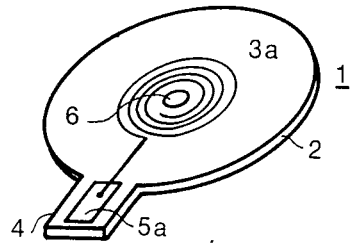
Figure 1:
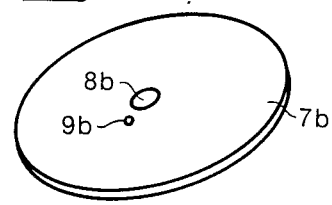
Figure 1:
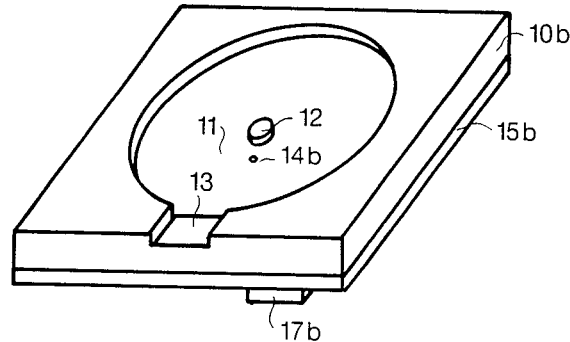

An embodiment of filter apparatus in accordance with the present invention is illustrated in FIG. 1 in pespective, exploded depiction. The numeral 1 denotes a coil unit comprising an insulating disc 2 and two coils, of which one is denoted 3a. The coils are formed as printed circuits on the insulating disc and are situated opposite each other on either side thereof. In accordance with the example, the printed circuit which forms the conductor of coil 3a (visible in the figure) is disposed in spiral configuration. The conductor of the other coil, 3b (not visible in the figure), is disposed in the same way as the conductor of the coil 3a, but in the opposite direction, so that each of the conductors is opposite the other along its entire length. At the middle of one side, the insulating disc 2 has a procjecting part 4 with a conductive upper surface 5a, to which the outer end point of the coil 3a is connected. A corresponding conductive surface 5b is situated on the surface of the projecting part 4 opposite to the surface 5a and is connected to the outer end point of the coil 3b, not seen in the figure. The disc 2 has a round hole 6 at its centre.

Two dielectric discs are denoted by 7a and 7b and are each provided with a round hole 8a and 8b as well as a further hole 9a and 9b. The size of the discs 7a and 7b is substantially in agreement with the size of the coil unit 1, excepting for the projecting part 4 of the latter. The diameter of the holes 8a and 8b also agree with the diameter of the hole 6 in the coil unit 1. The holes 9a and 9b are intended for the passage of conductors to the inner end points of the coils 3a and 3b.

Two ferrite elements 10a and 10b are each formed as square plates, which are intended to surround the coil unit 1 and the dielectric discs 7a and 7b. One ferrite element, 10b is thus provided with a circular recess 11 accommodating the coil unit 1 and the dielectric discs 7a and 7b. The size of the recess is therefore somewhat larger than the collective size of these units. At the centre of the recess, there is a circular boss 12. The diameter of the boss is somewhat less than the diameters of the holes 6, 8a and 8b. The ferrite element 10b also has a recess 13 for the projecting part 4 of the coil unit 1 and a hole 14b for the passage of a line to the inner end point of the coil 3b (not visible in the figure).

The other ferrite element, 10a, is formed as a flat plate of the same size as the ferrite element 10b and is intended to cover the coil unit 1 and the dielectric discs 7a and 7b when these are accommodated in the recess 11 of the ferrite element 10b. The ferrite element 10a also has a hole, not visible in the figure, corresponding to the hole 14b in the ferrite element 10b for a line passage.

Each of the ferrite elements has on one side a conductive earth plane 15a and 15b in the form of an aluminium coating. These coatings are in turn coated on their sides facing away from the ferrite element with a thin layer of aluminium oxide, not illustrated in the figure, which has been obtained by such as anodizing these sides. Thereis an unanodized surface 16a on the aluminium coating 15a intended to serve as an earth terminal. In the case where the filter apparatus is utilised in a metalic apparatus cabinet, this surface is connected to the wall of the cabinet. There is a corresponding unanodized surface on the aluminium coating 15b.

On each oxide layer there is a layer 17a and 17b of copper, whereby the earth planes 15a, 15b and these copper layers can function as two flat capacitors, in which the intermediate oxide layers constitute the dielectrics. In the copper layer 17a there is a hole 18a for the passage of a line to the inner end point of the coil 3a. There is also a corresponding hole for the other coil in the earth plane 15b and the copper layer 17b.

Figure 2:
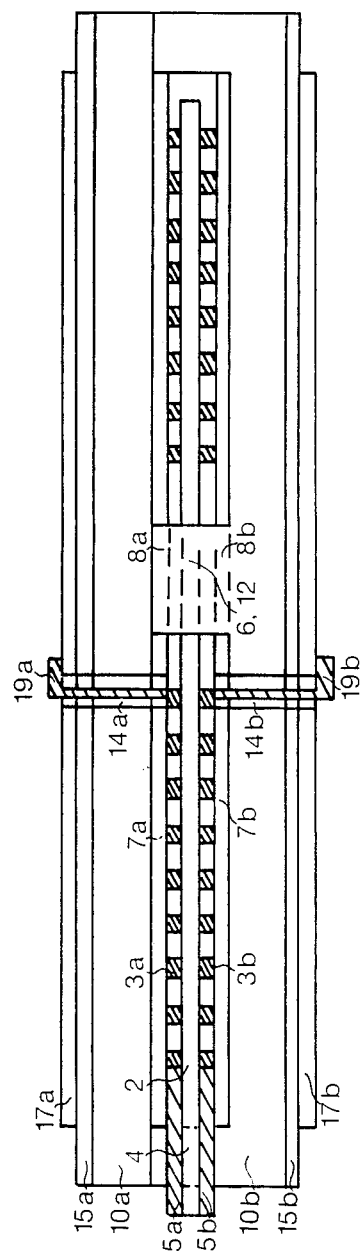
FIG. 2 is a sectional side view of the apparatus according to FIG. 1 in an assembled condition.

The same filter apparatus is illustrated in FIG. 2 as in FIG. 1, but in an assembled state and in cross section from one side. Identical parts have the same reference denotations as in FIG. 1. The apparatus according to FIGS. 1 and 2 have been drawn to different scales for the sake of clarity, and for the same reason the parts therein have been given different, partially incorrect proportions. There are lines 19a and 19b connecting the inner end points of the coils 3a and 3b to the copper layers 17a and 17b.

In a practical embodiment, the filter apparatus may be about 2 cm square, about 3 mm thick, and the coils have slightly more than ten turns each.

The surfaces 5a and 5b constitute the connection poles of the filter apparatus towards one side of the two-wire line, e.g. in towards an apparatus cabinet, while the copper layers 17a and 17b constitute corresponding poles towards the other side of the two-wire line, e.g. out towards a transmission line. Useful signals will thus pass, for example, one coil from its outer end point to its inner end point, the two-wire transmission line and then the other coil from its inner end point to its outer end point.

If the filter apparatus is utilised to suppress interference to, or from transmission equipment situated in a screened apparatus cabinet, it is suitably connected adjacent the cable lead-through in the cabinet wall, possibly to connection means for the outside transmission lines.

Figure 3:
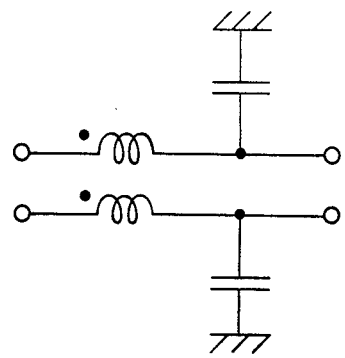
FIGS. 3-5 show the equivalent circuitry of the apparatus for different frequency intervals.

The filter apparatus operates in different ways, depending on the frequency. For frequencies under about 1 MHz, the equivalent circuitry of the apparatus has the appearance seen in FIG. 3. The apparatus the corresponds to a lowpass filter built up from discrete components in the form of a current-compensated coil and two capacitors. Since the coils of the apparatus are equally as great, and each one of the conductors of the coils is opposite the conductor of the other coil along its entire length, the magnetic fields generated in the coils as the result of useful signals substantially cancel out each other. The effect of the filters is thus inhibited for such signals. This applies on the condition above that both inner end points of the coil constitute connection poles of the filter apparatus towards one side of the two-wire line and vice versa. On the other hand, asymmetric noise signals do not give rise to counteracting magnetic fields in the coils, and can therefore already be attenuated sufficiently at about 150 KHz, on the same condition.

Figure 4:
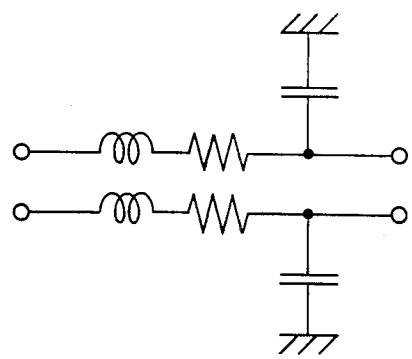

The equivalent circuitry of the filter apparatus for frequencies between about 1 and about 10 MHz is shown in FIG. 4. The coils function here as inductive elements with resistive losses. The losses are due to the magnetic losses occuring in the ferrite elements 10a, 10b at high frequencies, and achieve that substantially asymmetric interference signals will be attenuated.

Figure 5:
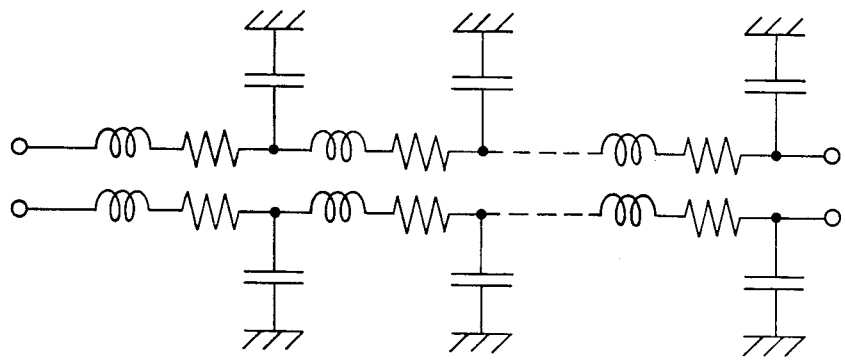

The equivalent circuitry of the filter apparatus for frequencies over about 10 MHz is illustrated in FIG. 5. The wavelength of the noise in the coils for these frequencies is of the same order of magnitude as the coil conductor lengths. Each of the coils thus functions as its own loss-impaired transmission line disposed over an earth plane and containing distributed resistance, inductance and capacitance. The earth plane consists here of the inner capacitor coatings 15a, 15b and the ferrite elements 10a, 10b, which function as dielectrics between the conductors of the coils and the earth plane. The losses are primarily due to the magnetic losses in the ferrite elements, but to a certain extent are also due to the resistance increasing with the frequency in the coil conductors, as a result of decreasing penetration ability of the current into the conductors at higher frequencies.

The apparatus described above can be varied within the scope of the claims. For example, the dielectric discs 7a and 7b may be replaced by air layers if suitable spacer means are inserted between the coil unit 1 and the ferrite elements 10a and 10b. Of course, shapes and material selections other than the ones described above are also conceivable. For example, the insulating disc 2 could be rectangular instead of round, and possibly the coils 3a and 3b formed by printed circuits could be desposed in a rectangular configuration instead of in a spiral. In such a case, the discs 7a and 7b and the recess 11 should also have a rectangular cross section. In addition, both ferrite elements may be provided with its part of the recess 11 and recess 13. Similarly, the proposed metals and oxide layers in the capacitors may be replaced by other suitable metals and by other suitable dielectrics, respectively.

What is claimed is:

1. A loss-impaired filter apparatus for suppressing radio frequency interference on a two-wire line, characterized in that the apparatus contains a coil unit (1) comprising two coils (3a, 3b) which are formed as printed circuits with a printed conductor going from an inner end point on either side of an insulating plate (2), each of the coil conductors being situated directly opposite the other coil conductor along its entire length, the inner end points of the coils being connected to a first terminal pair of the filter apparatus and the outer end points of the coils being connected to a second terminal pair of the filter apparatus, the apparatus also containing a ferrite casing (10a, 10b) surrounding the coil unit (1), and a pair of parallel-plate capacitors (15a, 17a and 15b, 17b) the plates of which are arranged substantially parallel to the insulating plate (2), one of the pair of parallel-plate capacitors being disposed on one side of the ferrite casing and the other capacitor being disposed on another side of the casing, the two sides of the ferrite casing (10a, 10b) facing away from each other and the coil unit (1), each of the plates (17a, 17b) on the ferrite casing disposed farthest away from the coil unit (1) being connected to its nearest inner end point of the coils (3a, 3b), and the other plates (15a, 15b) in the pair of capacitors being earth terminals.

2. Filter apparatus as claimed in claim 1, characterized in that dielectric layers (7a, 7b) delimit the coil conductors (3a, 3b) from the ferrite casing (10a, 10b).

3. Filter apparatus as claimed in claim 2, characterized in that the ferrite casing consists of two ferrite plates, of which one has a recess accommodating the coil unit.

4. Filter apparatus as claimed in claim 1, characterized in that the ferrite casing (10a, 10b) consists of two ferrite plates, of which one, (10b) has a recess (11) accommodating the coil unit (1).

5. Filter apparatus as claimed in claim 1, characterized in that each of the pair of parallel-plate capacitors comprises two metal coatings (15a, 17a and 15b, 17b) on the ferrite casing and an intermediate dielectric, the intermediate dielectric being an oxidation layer on the metal coating (15a, 15b) situated nearest the coil unit (1).

6. Filter apparatus as claimed in claim 1, characterized in that dielectric layers (7a, 7b) delimit the coil conductors (3a, 3b) from the ferrite casing (10a, 10b), and the dielectric layers, the ferrite casing, and the pair of parallel-plate capacitors (15a, 17a and 15b, 17b) are provided with holes, (e.g. 9a, 9b, 14b, 18a) situated directly opposite each other, the holes forming passages for conductors between the inner end points of the coils and the plates (17a, 17b) on the ferrite casing disposed farthest away from the coil units.

* * * * *